(12) United States Patent
Liu et al.

(10) Patent No.: US 11,247,907 B2
(45) Date of Patent: Feb. 15, 2022

(54) METHOD AND ARRANGEMENT FOR MANUFACTURING A GRAPHENE FILM

(71) Applicant: SHT SMART HIGH-TECH AB, Gothenburg (SE)

(72) Inventors: Johan Liu, Västra Frölunda (SE); Peng Su, Gothenburg (SE)

(73) Assignee: SHT SMART HIGH-TECH AB, Gothenburg (SE)

( * ) Notice: Subject to any disclaimer, the term of this patent is extended or adjusted under 35 U.S.C. 154(b) by 191 days.

(21) Appl. No.: 16/620,227

(22) PCT Filed: Jun. 8, 2017

(86) PCT No.: PCT/SE2017/050607
§ 371 (c)(1),
(2) Date: Dec. 6, 2019

(87) PCT Pub. No.: WO2018/226130
PCT Pub. Date: Dec. 13, 2018

(65) Prior Publication Data
US 2020/0198976 A1   Jun. 25, 2020

(51) Int. Cl.
*C01B 32/194* (2017.01)
*C01B 32/184* (2017.01)
*B82Y 40/00* (2011.01)

(52) U.S. Cl.
CPC .......... *C01B 32/194* (2017.08); *C01B 32/184* (2017.08); *B82Y 40/00* (2013.01)

(58) Field of Classification Search
CPC ... C01B 32/194; C01B 32/184; C01B 32/182; C01B 32/198; C01B 2204/00; C01B 2204/02; C01B 2204/04; C01B 2204/06; C01B 2204/065; C01B 2204/20; C01B 2204/22; C01B 2204/24; C01B 2204/26;
(Continued)

(56) References Cited

U.S. PATENT DOCUMENTS

2015/0075667 A1   3/2015   Mchugh et al.
2015/0151528 A1   6/2015   Shimizu et al.
(Continued)

FOREIGN PATENT DOCUMENTS

WO        2007085708 A1   8/2007
WO    WO 2007/085708    *   8/2007 ................ C09J 7/02

OTHER PUBLICATIONS

Machine Translation of WO 2007/085708 to Laudan (Year: 2007).*
(Continued)

*Primary Examiner* — Daniel C. McCracken
(74) *Attorney, Agent, or Firm* — RMCK Law Group, PLC

(57) ABSTRACT

According a first aspect of the invention, there is provided an arrangement for manufacturing a roll of graphene. The arrangement comprises a supply reel configured to hold a strip of graphene film; a winding reel configured to wind a strip of graphene film into a roll of graphene film; a motor controlling the winding reel; and a dispenser configured to dispense a fluid adhesive on a graphene film running from the supply reel to the winding reel. There is also provided a method form manufacturing a graphene film using sing the described arrangement, where the method comprises cutting the manufactures graphene roll into sheets of graphene film.

8 Claims, 4 Drawing Sheets

(58) Field of Classification Search
CPC ............ C01B 2204/28; C01B 2204/30; C01B 2204/32; B82Y 40/00; H01L 23/373
See application file for complete search history.

(56) References Cited

U.S. PATENT DOCUMENTS

2015/0262724 A1* 9/2015 Naito ...................... H01B 1/02
                                                      428/138
2017/0291332 A1* 10/2017 Braley ................... B32B 27/38

OTHER PUBLICATIONS

Zhang, et al., High-performance thermal interface materials consisting of vertically aligned graphene film and polymer, Carbon 2016; 109: 552-557 (Year: 2016).*
Han, D. et al., "Vertically and compactly rolled-up reduced graphene oxide film/epoxy composites: a two-stage reduction method for graphene-based thermal interfacial materials," RSC Advances 5 (2015), pp. 94426-94435.
Krebs, F. et al., "A roll-to-roll process to flexible polymer solar cells: model studies, manufacture and operational stability studies," Journal of Materials Chemistry, vol. 19, 2009, pp. 5442-5451.
PCT International Search Report and Written Opinion dated Jan. 16, 2018 for International Application No. PCT/SE2017/050607, 11 pages.
Zhang, Y. et al., "High-performance thermal interface materials consisting of vertically aligned graphene film and polymer," Carbon 109 (2016), pp. 552-557.

* cited by examiner

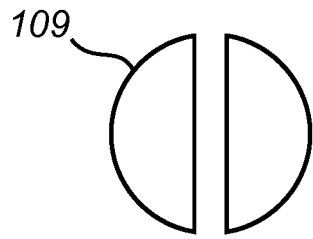
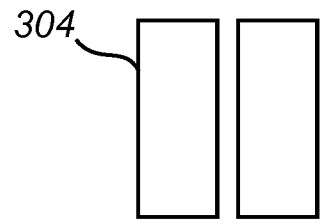
Fig. 3A  Fig. 3B
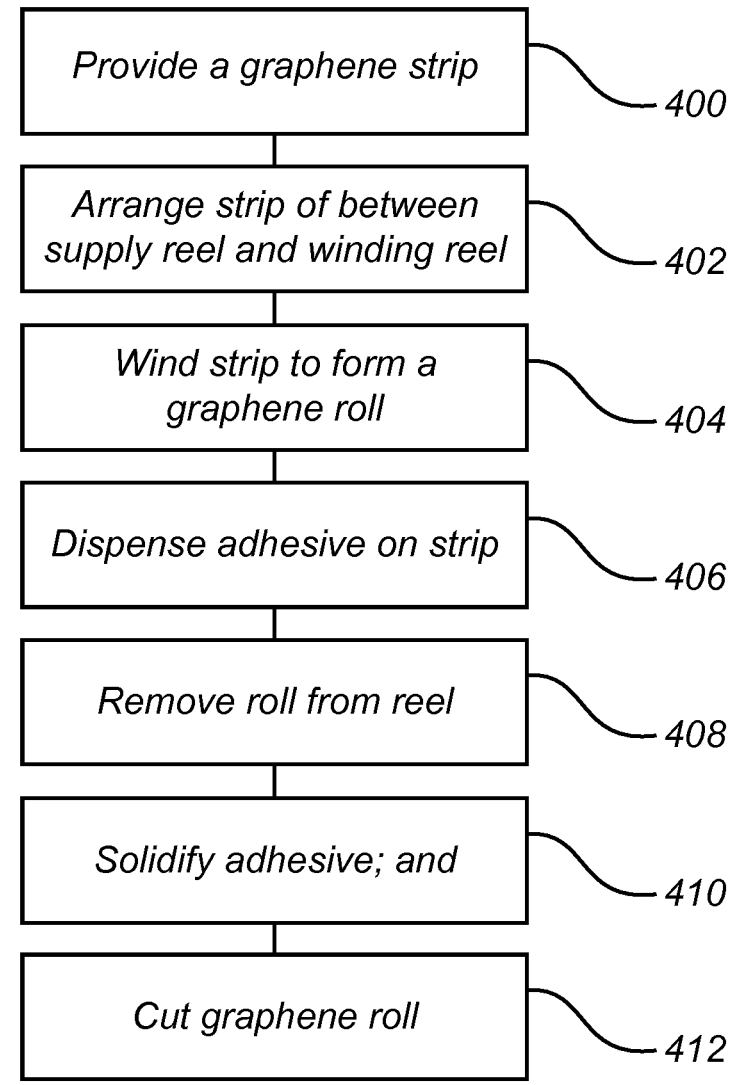
Fig. 4

METHOD AND ARRANGEMENT FOR MANUFACTURING A GRAPHENE FILM

CROSS-REFERENCE TO RELATED APPLICATIONS

This application is a 371 U.S. National Stage of International Application No. PCT/SE2017/050607, filed Jun. 8, 2017. The disclosure of the above application is incorporated herein by reference in its entirety.

FIELD OF THE INVENTION

The present invention relates to method and arrangement for manufacturing a graphene film. In particular, the present invention relates to method and arrangement for manufacturing graphene film comprising vertically aligned graphene.

BACKGROUND OF THE INVENTION

With the continuous development of modern electronics devices and systems, their increasing power densities have caused higher operating temperature. Therefore, effective thermal management is becoming extremely crucial to remove the large amount of heat required for ensuring high performance and long lifetime reliability. Thermal conductivity of traditional TIMs, a very important element for heat dissipation, are often less than max 20 W/mK, usually around 4 or 5 W/mK in vertical directions. Great efforts have hence been made to develop high performance TIMs based on carbon materials (e.g., graphite nano-platelets, carbon nanotubes and carbon fibers) in order to solve this problem.

A considerable number of studies have been devoted to increase their thermal conductivity by increasing the graphene loading in graphene based thermally conductive adhesives. However, it is not practical for the fabrication process when the graphene content is too high.

Graphene, a surprising allotrope of carbon which is comprised of only one layer of atoms arranged in a two-dimensional hexagonal lattice, exhibits a number of unique properties, such as ultrafast electron mobility, super high mechanical strength, and unusually superior thermal performance (in-plane thermal conductivity=5000 W/mK). Besides, it is necessary to arrange graphene into particular structures so as to fulfill diverse functionalities, especially application in electronic devices.

For TIMs, high thermal conductivity in the vertical direction is needed. Therefore, it is essential to assemble graphene into a vertically aligned architecture to facilitate heat dissipation in the normal direction of contact solid interfaces. It is already reported to prepare vertically aligned graphite film by compacting aligned graphite sheet. However, it's difficult to fabricate this type of material in an automatic and cost-effective way.

Therefore, improved methods to vertically align graphene are desired to increase the out-of-plane thermal conductivity (Vertical direction) of TIMs.

SUMMARY

In view of above-mentioned and other drawbacks of the prior art, it is an object of the present invention to provide an arrangement and a method facilitating large scale manufacturing of a film consisting of vertically aligned graphene.

According a first aspect of the invention, there is provided an arrangement for manufacturing a roll of graphene. The arrangement comprises a supply reel configured to hold a strip of graphene film; a winding reel configured to wind a strip of graphene film into a roll of graphene film; a motor controlling the winding reel; and a dispenser configured to dispense a fluid adhesive on a graphene film running from the supply reel to the winding reel.

The strip of graphene film used to form the roll of graphene may for example be wound on the supply reel. However the graphene strip may also be provided as an elongated or bundled strip. Moreover, the graphene strip is a strip of horizontally aligned graphene and the purpose of the described arrangement is to prepare a roll of graphene for subsequent forming of sheets or films of vertically aligned graphene to be used as a thermal interface material (TIM).

The motor controlling the winding reel is advantageously a motor having a controllable speed such that the rotational speed of the winding reel can be controlled. The motor speed may be continuously or stepwise variable. The motor speed may also be varied with respect to the increasing diameter of the resulting graphene roll on the winding reel such that the propagation velocity of the graphene film between the supply reel and the winding reel is constant.

The dispenser is configured to automatically dispense an adhesive onto a graphene film being fed from the supply reel to the winding reel by means of the motor. Moreover, the dispenser is advantageously arranged above the feeding path of the graphene strip such that a fluid adhesive can be provided from the dispenser onto the graphene strip by means of the gravitational force. It is also possible to provide an adhesive by means of spray coating or spreading.

The present invention is based on the realization that an improved method for manufacturing of a roll of graphene film can be achieved by means of the above described reel-to-reel arrangement where an adhesive is automatically and controllably provided to the graphene strip prior to forming of the graphene roll. Thereby, the width of the graphene strip, the thickness of the adhesive layer on the strip and the subsequent thickness, i.e. the number of layers, of the finalized graphene roll can be configured to achieve a graphene roll with the desired properties.

According to one embodiment of the invention, the arrangement may further comprise a compression roller arranged adjacent to the winding reel, the compression roller being configured to compress a roll of graphene film on the between the compression roller and the winding reel. Accordingly, the compression roller I configured to press the graphene strip between the roller and the already formed graphene roll. Thereby, the compression roller ensures that there are no air gaps in the adhesive between consecutive layers of the graphene strip in the formed roll. Moreover, the pressure of the compression roller can be controlled which in turn enables controlling the amount of adhesive located between the consecutive layers of the graphene strip, where an increased pressure results in a decreased thickness of adhesive since the fluid adhesive will pressed out a the sides of the roll. The compression roller also ensures that the adhesive layer between consecutive layers of the graphene strip is evenly distributed along the width of the strip.

According to one embodiment of the invention, the arrangement may further comprise a blade arranged between the dispenser and the winding reel, the blade being configured to be arranged at a predetermined distance from the graphene strip and further configured to remove excessive adhesive from the graphene film. Thereby, the thickness and the uniformity of the adhesive layer can be improved and controlled by controlling the position of the blade. The blade is advantageously movable in a vertical direction to enable the amount of adhesive to be controlled.

According to one embodiment of the invention, the arrangement may further comprise a support plate configured to support the graphene film for at least a portion of the distance between the supply reel and the winding reel. The support plate may thus act to provide a more controlled path for the graphene strip. The support plate may advantageously be located at least at a portion of the distance between the supply reel and the winding reel where the dispenser is located in order to mechanically support the graphene strip when the adhesive is dispensed onto the strip. The support plate may further comprise a track in which the graphene strip moves, thereby guiding the graphene strip. The track may comprise sidewalls protruding from the support plate. The track may also be formed as a recess or a trench in the support plate in which the graphene film runs. Moreover, the track may advantageously have an adjustable width to allow for manufacturing of graphene rolls of different width.

According to one embodiment of the invention, the support plate may be tiltable. Moreover, the vertical position of the winding reel may be correspondingly adjustable in relation to the vertical position of the supply reel. A tilted support plate and a correspondingly controllable winding reel can be used to control the tension of the graphene strip. The tension will in turn influence the properties of the resulting graphene roll in that an increased tension may reduce the thickness of the adhesive layer between consecutive layers of the graphene strip of the graphene roll. An increased tension will result in a reduced thickness of the adhesive since more of the adhesive may be pressed out at the sides of the graphene roll. However, it should also be noted that a too high tension may cause the graphene strip to break.

According to one embodiment of the invention the dispenser may advantageously be a dispenser wheel further comprising a container supplying an adhesive to the wheel. The adhesive will then be provided from the adhesive container to the dispenser wheel after which the wheel rotates to deposit the adhesive onto the graphene strip. The dispenser wheel may comprise compartments for receiving the adhesive from the adhesive container and for transporting the adhesive to the graphene strip.

According to one embodiment of the invention, the dispenser wheel may comprise protrusions in the form of cogs and/or vanes such that a compartment is formed between adjacent protrusions. The cogs and/or vanes thereby protrude from the wheel to form compartments in between adjacent protrusions such that the adhesive can be transported to the graphene strip. The size of and distance between the protrusions can be determined and configured based on the properties of the adhesive, such as the viscosity, and based on the desired thickness of the adhesive on the graphene strip. The compartments may or may not comprise sidewalls.

According to one embodiment of the invention, the vanes may have a trapezoidal cross section such that a portion of the vane being located closest to the wheel center is smaller than a portion of the vane being located farthest from the wheel center. Thereby, a compartment more suitable for transporting a low viscosity adhesive is provided compared to a dispenser wheel having triangular cogs protruding from the wheel, which may be suitable for an adhesive having a high viscosity.

According to one embodiment of the invention the dispenser may be configured to make contact with the graphene film and to rotate according to a movement of the graphene film. Thereby, uniform dispensing of the adhesive can be achieved automatically irrespective of the feeding speed of the graphene strip. For large variations of the feeding speed, it may be required to adjust the amount of adhesive provided from the adhesive container to the dispenser wheel. The amount of adhesive provided to the wheel from the adhesive container may for example automatically controlled to be proportional to the rotation speed of the dispenser wheel.

According to one embodiment of the invention the arrangement may advantageously comprise a motor arranged to control a rotation of the wheel dispenser. Thereby, the adhesive can be evenly dispensed without the need for the dispenser wheel to make contact with the moving graphene strip. The rotational speed of the dispenser wheel may advantageously be proportional to the feeding speed of the graphene strip.

According to one embodiment of the invention, the winding reel may comprises a pair of winding needles configured to hold the graphene film and to form the center of the graphene roll, wherein each of the winding needles has a rectangular or semi-circular cross section. To start the winding of the graphene roll, the graphene strip is thus held between the two opposing needles. For needles having a semi-circular cross section, the flat side of the respective needle is facing each other with the graphene strip pressed therebetween. Using semi-circular needles result in a circular cross section of the graphene roll. Correspondingly, using needles having a rectangular cross section will result in a graphene roll having a rectangular cross section. Thereby, the cross section of the graphene roll can be controlled by controlling the cross section of the needles.

According to a second aspect of the invention, there is provided a method of manufacturing a graphene film comprising vertically aligned graphene. The method comprises providing a strip of horizontally aligned graphene arranged on a supply reel; arranging the strip of graphene between the supply reel and a winding reel; winding the strip of graphene from the supply reel onto the winding reel, forming a graphene roll; dispensing an adhesive on the strip of graphene between the supply reel and the winding reel; removing the graphene roll from the winding reel; solidifying the adhesive; cutting the graphene roll, forming a graphene film having a shape corresponding to the cross section of the graphene roll.

The strip of horizontally aligned graphene is formed according to known methods and such strips or films are also commercially available. A roll of graphene is formed by arranging an adhesive on the graphene strip and by forming a roll of the strip. The adhesive is subsequently solidified in a heating step. To form a graphene film with vertically aligned graphene, the graphene roll is cut, which for example may be done using a blade cutting machine, a laser cutting machine or plasma cutter.

According to one embodiment of the invention, the method may further comprise controlling a ratio between graphene and adhesive in the graphene roll. The volume ratio between adhesives and graphene in the graphene roll may for example be 5:1, 4:1, 3:1, 2:1 or 1:1 based on diverse application requirements or environmental features. The volume ratio changes the thermal management performance and the mechanics and strength of vertical alignment graphene films.

According to one embodiment of the invention, controlling the ratio between graphene and adhesive in the graphene roll may comprise controlling the tension of the strip of graphene between the supply wheel and the winding reel.

According to one embodiment of the invention controlling the ratio between graphene and adhesive in the graphene roll may comprise controlling the amount of adhesive being dispensed per unit length of the graphene strip.

Additional effects and features of the second aspect of the invention are largely analogous to those described above in connection with the first aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing an example embodiment of the invention, wherein:

FIG. 3 schematically illustrates features of an arrangement according to an embodiment of the invention;

FIG. 4 is a flow chart outlining the general steps of a method according to an embodiment of the invention;

DETAILED DESCRIPTION OF EXAMPLE EMBODIMENTS

Figure 1:
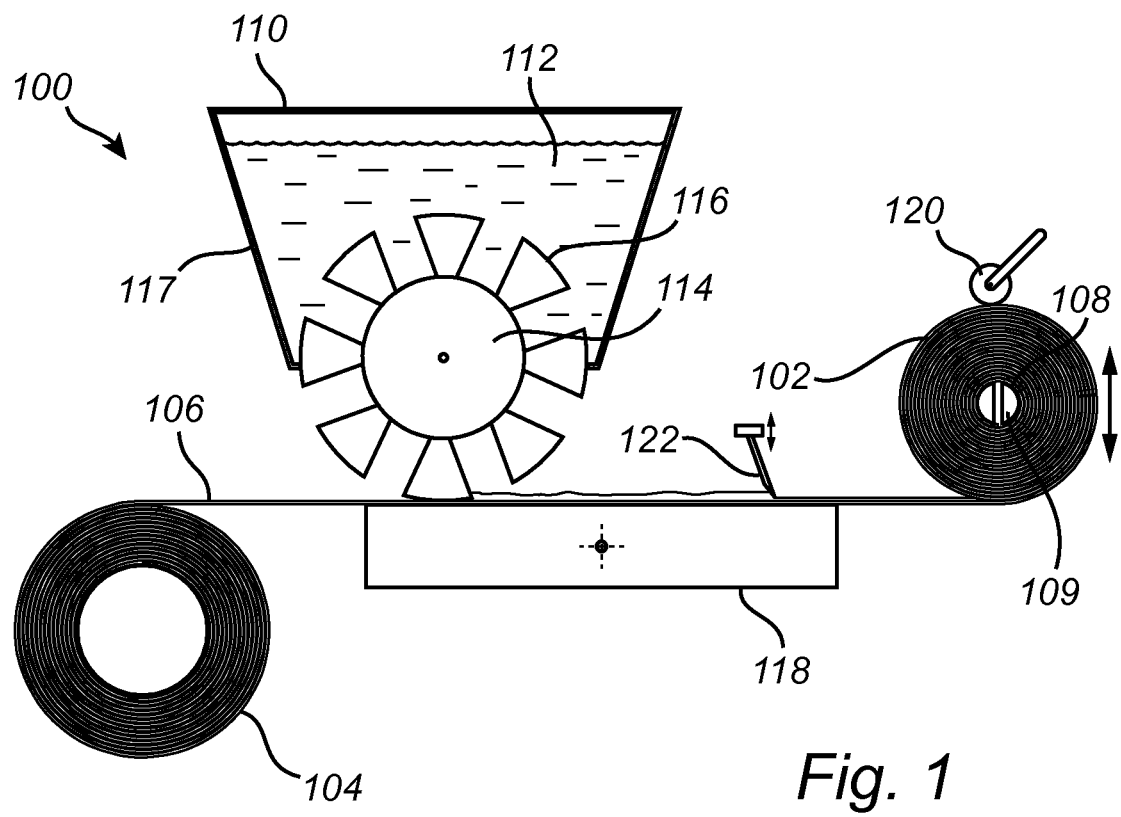
FIG. 1 schematically illustrates an arrangement according to an embodiment of the invention.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person. Like reference characters refer to like elements throughout.

FIG. 1 schematically illustrates an arrangement 100 for manufacturing a roll 102 of graphene. The arrangement comprises a supply reel 104 configured to hold a strip 106 of graphene film, a winding reel 108 configured to wind the strip 106 of graphene film into a roll 102 of graphene film. The winding reel comprises semi-circular winding needles 109 for holding the graphene strip and to form a cylindrical graphene roll. The winding reel 108 is further connected to a motor (not shown) controlling the rotation of the winding reel 108. The arrangement further comprises a dispenser 110 configured to dispense a fluid adhesive 112 on the graphene film 106 running from the supply reel 104 to the winding reel 108.

The dispenser 110 is here illustrated as a dispenser wheel 114 comprising a plurality of protrusions formed as vanes 116. The resulting dispenser wheel 114 can also be referred to as an impeller. A portion of the dispenser wheel 114 is located in a container 117 containing the adhesive 112. It should be noted that other types of dispensing systems also may be used to provide an adhesive on the graphene strip 106. The adhesive may for example be spray coated or spread onto the strip. Accordingly, a dispenser may be arranged and configured in many different ways.

The arrangement 100 of FIG. 1 further comprises a support plate 118 which may comprise guiding tracks (not shown) for aligning the graphene film 106 with the dispenser 110. The support plate 118 may be tiltable to adjust the inclination of the feeding path and the position of the winding reel 108 may be correspondingly adjustable in a vertical direction. Accordingly, if the winding reel 108 is arranged higher than the supply reel 104, the path from the supply reel 104 to the winding reel 108 exhibits an upward inclination. Thereby, by controlling the tilt of the support plate 118 and the elevation of the winding reel 108, the tension of the graphene strip 106 can be controlled.

FIG. 1 further illustrates that the arrangement comprises a compression roller 120 arranged adjacent to the winding reel to compress the graphene roll. By controlling the pressure of the compression roller against the roll of graphene, the thickness of the layer of adhesive can be further controlled, where an increased pressure results in a thinner layer of adhesive since more of the adhesive will be pressed out of the sides of the roll.

Moreover, FIG. 1 further illustrates that the arrangement 100 comprises a blade 122 arranged above the support plate 118 and between the dispenser 110 and the winding reel 108. The blade 122 acts to control the thickness of the adhesive on the graphene film based on the distance between the blade edge and the graphene strip 106. The elevation of the blade 122 is controllable to control the thickness of the adhesive, and thereby the ratio between adhesive and graphene in the final graphene roll.

Figure 2:
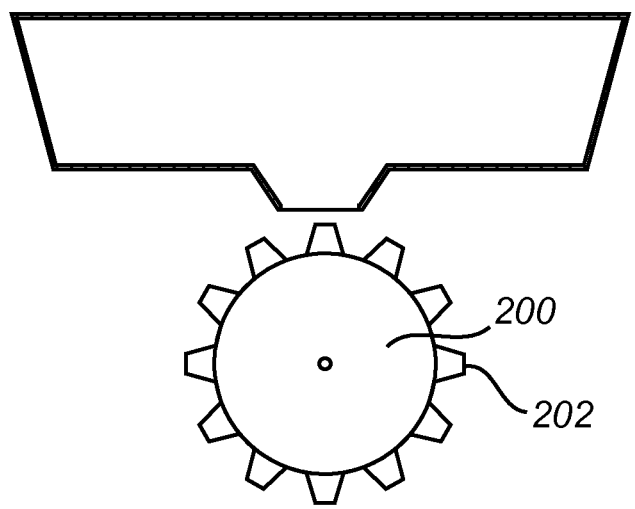
FIG. 2 schematically illustrates features of an arrangement according to an embodiment of the invention.

FIG. 2 schematically illustrates a dispenser in the form of a cogwheel 200 comprising protruding cogs 202. The cogwheel shaped dispenser wheel 200 may be preferable for use with adhesives having a lower viscosity since such an adhesive may not release as easily from a dispenser wheel 114 of the impeller vane type.

FIGS. 3A-B schematically illustrate cross sections of winding needles 109, 304 used at the center of the winding reel 108. FIG. 3A illustrates winding needles 109 having a semicircular cross section resulting in a circular graphene roll, and FIG. 3B illustrates winding needles 304 having a rectangular cross section resulting in a rectangular graphene roll. Other shapes are also feasible, such as triangular, diamond and hexagonal cross sections.

FIG. 4 is a flow chart outlining the general steps of a method for manufacturing a graphene film comprising vertically aligned graphene. The method will described with further reference to the arrangement 100 illustrated in FIG. 1.

The method comprises providing 400 a strip of horizontally aligned graphene arranged on a supply reel. In a preprocessing step, films comprising horizontally aligned graphene were cut to ribbons which width depends on the requirement of application. The ribbons were connected end to end by an adhesive which is preferably the same as used in the winding and rolling up process. Next, the connected ribbons of graphene films were rolled up to prepare the supply reel 104.

The strip of graphene is arranged 402 between the supply reel 104 and the winding reel 108 and the graphene strip is subsequently wound 404 from the supply reel 104 onto the winding reel 108 forming a graphene roll while dispensing 406 an adhesive on the strip of graphene between the supply reel and the winding reel.

The rolling speed of the winding wheel 108 can be controlled by adjusting the speed of motor connected with winding needles 109, and an example maximum speed may be 180 rounds per minute (rpm). This winding process is continued until a cylinder with a target diameter was formed.

During the winding process, adhesives 112 are dispensed through the impeller vane 114 rotating in the adhesive container 117 and transporting the adhesive 112 onto the graphene strip. With the impeller blades 116 in contact with the moving graphene strip, the wheel 114 can be described as a driven wheel during the graphene films movement on the support plate 118, driven by the winding reel 108.

When the impeller vane 114 rotates, the fluid adhesive 112 in the adhesive container 117 can be fed into the gaps between impeller blades 116, and then adhesives move onto the surface of graphene strip from the gaps between the impeller blades 116.

Adhesives can be mono-component or multi-components with diverse polymers, including poly-di-methyl-siloxane (PDMS), poly-methyl meth-acrylate (PMMA), poly-vinyl alcohol (PVA), polyurethane (PU) and epoxy, which depends on the requirement of application, such as elasticity, flexibility and toughness. The multi-component adhesives formula (volume ratio) includes 1:1 with PDMS and PMMA, 1:1 with PDMS and PVA, 1:1 with PDMS and PU, 1:0.5:0.5 with PDMS, PMMA and PVA etc.

Once the adhesive is dispensed, a roll is formed with a uniform layer of adhesive between the layers of graphene in the roll, and the graphene roll is removed 408 from the winding reel 108.

Next, the adhesive is solidified 410. The required temperature and time for solidification of course depend on the type of adhesives. In the present example a temperature between 50 and 200° C. at a time from 2 hours to 10 hours may for example be used for a PMMA and silicon based adhesive.

Figure 5:
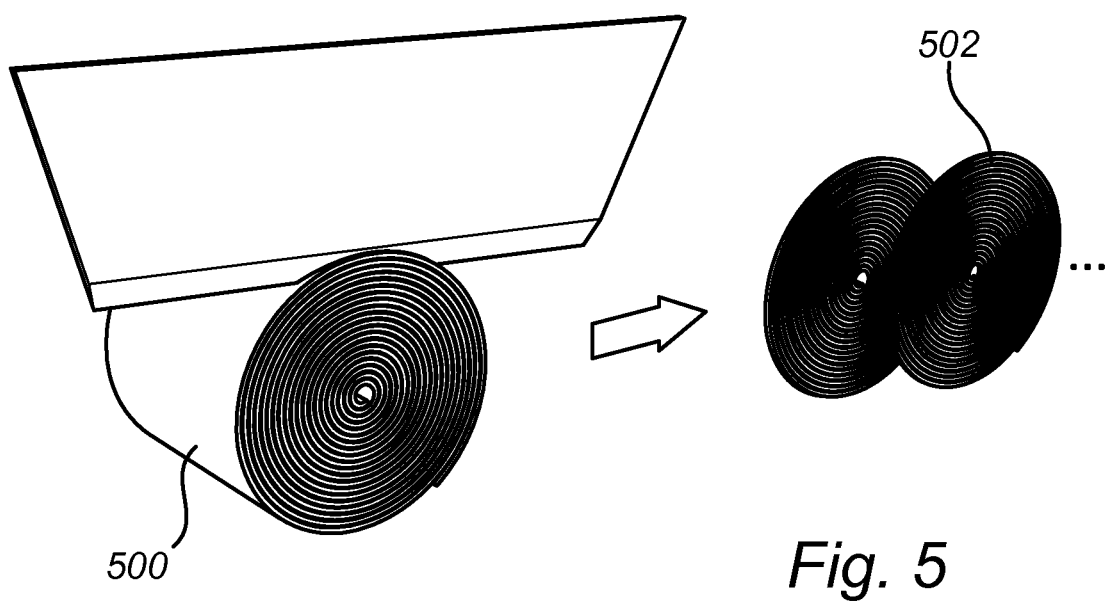
FIG. 5 schematically illustrates features of the invention.

Finally, as illustrated in FIG. 5, the removed graphene roll 500 is cut 412 to form a graphene film 512 having a shape corresponding to the cross section of the graphene roll. The thickness of the film can be from 50 micrometers and up. The diameter of the roll 500 may for example be between 1 and 10 cm.

Figure 6:
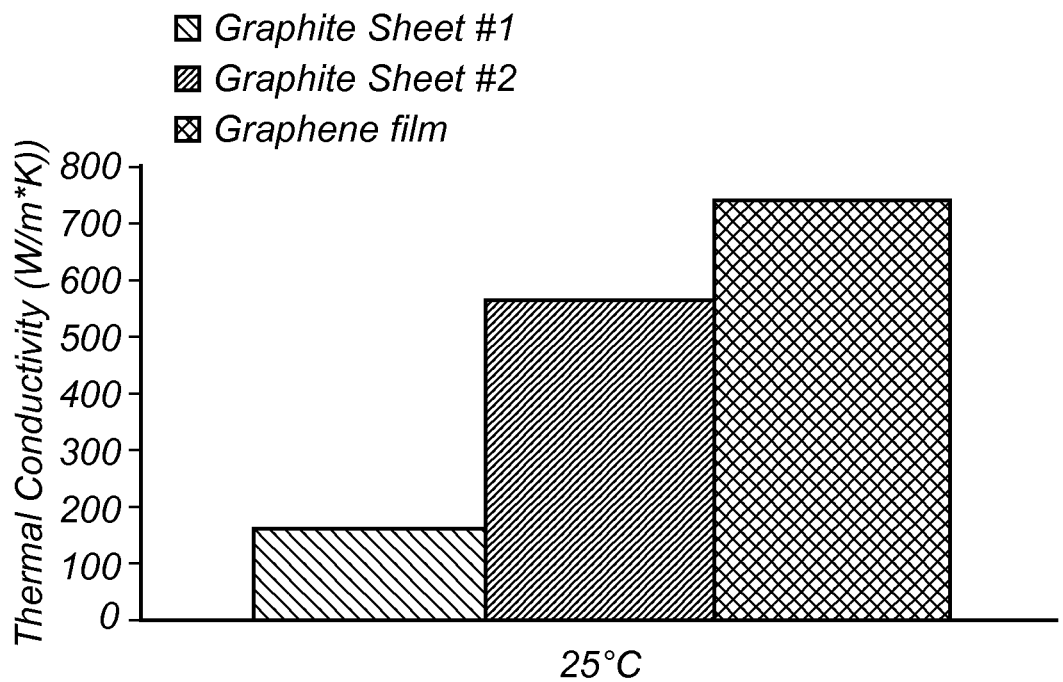
FIG. 6 is a graph illustrating properties of a film manufactured according to an embodiment of the invention.

FIG. 6 is a graph comparing the thermal conductivity of a vertically aligned graphene film manufactured according to the above described method with the thermal conductivity of commercially available graphite sheets.

Figure 7:
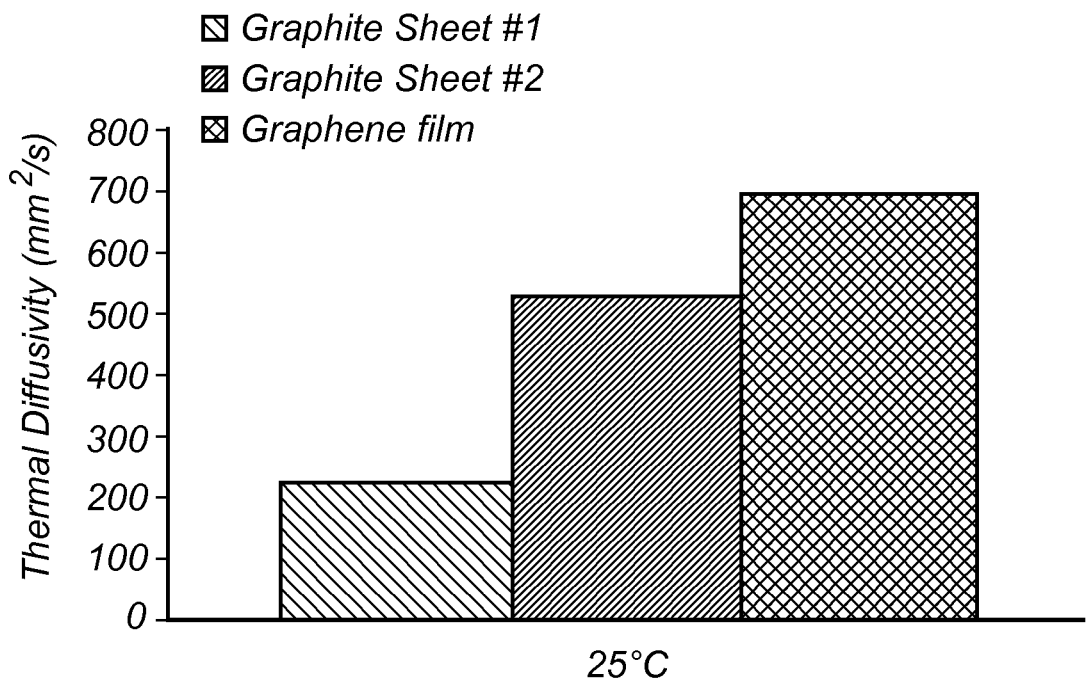
FIG. 7 is a graph illustrating properties of a film manufactured according to an embodiment of the invention.

FIG. 7 is a graph comparing the thermal diffusivity of a vertically aligned graphene film manufactured according to the above described method with the thermal conductivity of commercially available graphite sheets.

In both FIG. 6 and FIG. 7, the volume ratio between adhesive and graphite or graphene material is 1:1. As can be seen, the vertically aligned graphene film displays improved properties as a thermal interface material. In particular, the thermal conductivity of vertically aligned graphene films can be between 30 and 1500 W/mK, which is up to 150 times higher than for traditional TIMs (10 W/mK).

Even though the invention has been described with reference to specific exemplifying embodiments thereof, many different alterations, modifications and the like will become apparent for those skilled in the art. Also, it should be noted that parts of the arrangement may be omitted, interchanged or arranged in various ways, the arrangement yet being able to perform the functionality of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. An arrangement for manufacturing a roll of graphene, the arrangement comprising:
    a supply reel configured to hold a strip of graphene film;
    a winding reel configured to wind the strip of graphene film into a roll of graphene film;
    a motor controlling the winding reel;
    a dispenser configured to dispense a fluid adhesive on a graphene film running from the supply reel to the winding reel; and
    a support plate configured to support the graphene film for at least a portion of the distance between the supply reel and the winding reel, wherein the support plate is tiltable.

2. The arrangement according to claim 1, further comprising a compression roller arranged adjacent to the winding reel, the compression roller being configured to compress a roll of graphene film on the between the compression roller and the winding reel.

3. The arrangement according to claim 1, further comprising a blade arranged between the dispenser and the winding reel, the blade being configured to be arranged at a predetermined distance from the graphene film and configured to remove excessive adhesive from the graphene film.

4. An arrangement for manufacturing a roll of graphene, the arrangement comprising:
    a supply reel configured to hold a strip of graphene film;
    a winding reel configured to wind the strip of graphene film into a roll of graphene film;
    a motor controlling the winding reel; and
    a dispenser configured to dispense a fluid adhesive on a graphene film running from the supply reel to the winding reel,
    wherein the dispenser is a dispenser wheel further comprising a container supplying an adhesive to the wheel, and
    wherein the dispenser wheel comprises protrusions in the form of cogs and/or vanes such that a compartment is formed between adjacent protrusions.

5. The arrangement according to claim 4, wherein the vanes have a trapezoidal cross section such that a portion of the vane being located closest to the wheel center is smaller than a portion of the vane being located farthest from the wheel center.

6. The arrangement according to claim 4, wherein the dispenser is configured to make contact with the graphene film and to rotate according to a movement of the graphene film.

7. The arrangement according to claim 4, further comprising a motor arranged to control a rotation of the dispenser wheel.

8. An arrangement for manufacturing a roll of graphene, the arrangement comprising:
    a supply reel configured to hold a strip of graphene film;
    a winding reel configured to wind the strip of graphene film into a roll of graphene film;
    a motor controlling the winding reel; and
    a dispenser configured to dispense a fluid adhesive on a graphene film running from the supply reel to the winding reel,
    wherein the winding reel comprises a pair of winding needles configured to hold the graphene film and to form the center of the graphene roll, wherein each of the winding needles has a rectangular or semi-circular cross section.

* * * * *